(12) United States Patent
Kwon et al.

(10) Patent No.: US 10,431,744 B2
(45) Date of Patent: Oct. 1, 2019

(54) METHOD OF MANUFACTURING ORGANIC LIGHT-EMITTING DISPLAY APPARATUS USING BARRIER LAYER HAVING HIGH FLUORINE CONTENT

(71) Applicant: Samsung Display Co., Ltd., Yongin-si (KR)

(72) Inventors: Younggil Kwon, Yongin-si (KR); Seungyong Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/884,241

(22) Filed: Jan. 30, 2018

(65) Prior Publication Data

US 2018/0261769 A1      Sep. 13, 2018

(30) Foreign Application Priority Data

Mar. 10, 2017   (KR) .................. 10-2017-0030312

(51) Int. Cl.
*H01L 51/00*   (2006.01)
*G03F 7/00*    (2006.01)
(Continued)

(52) U.S. Cl.
CPC ........ *H01L 51/0018* (2013.01); *G03F 7/0007* (2013.01); *G03F 7/094* (2013.01);
(Continued)

(58) Field of Classification Search
CPC ............ H01L 27/3211; H01L 51/0003; H01L 51/001; H01L 51/0016; H01L 51/0018;
(Continued)

(56) References Cited

U.S. PATENT DOCUMENTS

2005/0202347 A1   9/2005   Houlihan et al.
2008/0166667 A1   7/2008   Goldfarb
(Continued)

FOREIGN PATENT DOCUMENTS

JP   2002-170669   6/2002
JP   2004-083900   3/2004
JP   2007528511    10/2007

OTHER PUBLICATIONS

Simonas Krotkus, et al., Influence of bilayer processing on p-i-n OLEDs: towards multicolor photolithographic structuring of organic displays, Proc. of SPIE, vol. 9360.

*Primary Examiner* — Stephen W Smoot
(74) *Attorney, Agent, or Firm* — H.C. Park & Associates, PLC

(57) ABSTRACT

A method of manufacturing an organic light-emitting display apparatus including: forming a lift-off layer including a fluoropolymer, a barrier layer having a higher fluorine content than the lift-off layer, and a photoresist on a substrate including a first electrode; removing a portion corresponding to the first electrode by patterning the photoresist, and leaving the remaining portion; exposing the first electrode by etching the lift-off layer and the barrier layer on the first electrode; forming an organic functional layer on the first electrode and on the remaining photoresist; removing the barrier layer, the photoresist, and the organic functional layer on the remaining lift-off layer; and forming a second electrode on the organic functional layer on the first electrode.

19 Claims, 19 Drawing Sheets

(51) Int. Cl.
- *G03F 7/20* (2006.01)
- *G03F 7/26* (2006.01)
- *G03F 7/09* (2006.01)
- *G03F 7/16* (2006.01)
- *H01L 51/52* (2006.01)
- *H01L 51/50* (2006.01)
- *H01L 27/32* (2006.01)

(52) U.S. Cl.
CPC .............. *G03F 7/16* (2013.01); *G03F 7/2002* (2013.01); *G03F 7/26* (2013.01); *H01L 27/3211* (2013.01); *H01L 51/001* (2013.01); *H01L 51/0003* (2013.01); *H01L 51/0016* (2013.01); *H01L 51/0023* (2013.01); *H01L 51/5012* (2013.01); *H01L 51/5228* (2013.01); *H01L 51/5203* (2013.01)

(58) Field of Classification Search
CPC ............. H01L 51/0023; H01L 51/5012; H01L 51/5056; H01L 51/5072; H01L 51/5088; H01L 51/5092; H01L 51/5203; H01L 51/5212; H01L 51/5228

See application file for complete search history.

(56) References Cited

U.S. PATENT DOCUMENTS

| | | | |
|---|---|---|---|
| 2010/0289019 A1 | 11/2010 | Katz et al. | |
| 2014/0353597 A1* | 12/2014 | Ahn | H01L 51/5265 257/40 |
| 2015/0060828 A1* | 3/2015 | Sago | H01L 51/56 257/40 |
| 2017/0025610 A1* | 1/2017 | Kwon | H01L 51/0007 |
| 2018/0033968 A1* | 2/2018 | Lee | H01L 27/3246 |
| 2018/0190907 A1* | 7/2018 | Kim | H01L 51/0016 |

* cited by examiner

METHOD OF MANUFACTURING ORGANIC LIGHT-EMITTING DISPLAY APPARATUS USING BARRIER LAYER HAVING HIGH FLUORINE CONTENT

CROSS-REFERENCE TO RELATED APPLICATION

This application claims priority from and the benefit of Korean Patent Application No. 10-2017-0030312, filed on Mar. 10, 2017, which is hereby incorporated by reference for all purposes as if fully set forth herein.

BACKGROUND

Field

Exemplary embodiments relate to an organic light-emitting display apparatus and a method of manufacturing the same.

Discussion of the Background

An organic light-emitting display apparatus is a self-emissive display apparatus, which includes a hole injection electrode, an electron injection electrode, and an organic emission layer between the hole injection electrode and the electron injection electrode, and in which holes injected from the hole injection electrode and electrons injected from the electron injection electrode recombine in the organic emission layer and are annihilated, thereby emitting light. The organic light-emitting display apparatus is considered as a next-generation display apparatus due to its high-quality characteristics, such as low power consumption, high brightness, and a fast response speed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments include an organic light-emitting display apparatus and a method of manufacturing the same, whereby resolution may increase and a failure rate may decrease.

Additional aspects will be set forth in part in the description which follows and, in part, will be apparent from the description, or may be learned by practice of the presented embodiments.

According to one or more exemplary embodiments, a method of manufacturing an organic light-emitting display apparatus includes: forming a first electrode on a substrate; forming a first lift-off layer including a fluoropolymer on the first electrode; forming a first barrier layer on the first lift-off layer, the first barrier layer having a higher fluorine content than the first lift-off layer; forming a first photoresist on the first barrier layer, the first photoresist having a first portion overlapping the first electrode and a second portion outside the first portion; removing the first portion of the first photoresist by patterning the first photoresist, such that the second portion of the first photoresist is remained on the first barrier layer; exposing the first electrode by etching the first lift-off layer and the first barrier layer disposed on the first portion of the first photoresist; forming a first organic functional layer including a first emission layer on the first electrode and the second portion of the first photoresist; removing remaining portions of the first lift-off layer, the first barrier layer, the first photoresist, and the first organic functional layer disposed on the second portion of the first photoresist; and forming a second electrode on the first organic functional layer.

The first lift-off layer may contain about 20 wt % to about 60 wt % of fluorine.

The first barrier layer may contain about 40 wt % to about 76 wt % of fluorine.

The first organic functional layer may further include at least one of a hole injection layer, a hole transport layer, an electron transport layer, and an electron injection layer.

The first organic functional layer may be formed by a deposition process.

A patterning process for removing a portion of the first photoresist may include a photolithography process.

The first electrode may be exposed by etching the first lift-off layer and the first barrier layer of the first portion with a first solvent including fluorine.

A first undercut profile may be formed in the first barrier layer under the first photoresist, and a second undercut profile may be formed in the first lift-off layer under the first barrier layer.

A shape of the first undercut profile and a shape of the second undercut profile may be different from each other.

The remaining portions of the first lift-off layer, the first barrier layer, the first photoresist, and the first organic functional layer disposed on the second portion may be removed by using a second solvent including fluorine.

The method may further include forming a pixel-defining layer surrounding edges of the first electrode.

The method may further include forming a first auxiliary cathode during a process of forming the first organic functional layer, before the forming of the second electrode.

According to one or more exemplary embodiments, a method of manufacturing an organic light-emitting display apparatus includes forming a plurality of primary electrodes on a substrate, performing a first unit process and a second unit process, and forming a secondary electrode after the first and second unit processes. The first unit process includes: (a1) forming a first lift-off layer including a fluoropolymer on a first primary electrode of the primary electrodes; (b1) forming a first barrier layer on the first lift-off layer, the first barrier layer having a higher fluorine content than the first lift-off layer; (c1) forming a first photoresist on the first barrier layer and removing a first portion of the first photoresist overlapping the first primary electrode by patterning the first photoresist, such that a second portion of the first photoresist outside the first portion is remained on the first barrier layer; (d1) exposing the first primary electrode by etching the first lift-off layer and the first barrier layer disposed on the first portion of the first photoresist; (e1) forming a first organic functional layer including a first emission layer on the first primary electrode and the second portion of the first photoresist; and (f1) removing remaining portions of the first lift-off layer, the first barrier layer, the first photoresist, and the first organic functional layer disposed on the second portion of the first photoresist. The second unit process includes: (a2) forming a second lift-off layer including a fluoropolymer on a second primary electrode of the primary electrodes; (b2) forming a second barrier layer on the second lift-off layer, the second barrier layer having a higher fluorine content than the second lift-off layer; (c2) forming a second photoresist on the second barrier layer and removing a third portion of the second photoresist overlapping the second primary electrode by patterning the second photoresist, such that a fourth portion of the second photoresist outside the third portion is remained on the second barrier layer; (d2) exposing the second primary electrode by etching the second lift-off layer and the second barrier layer disposed on the third portion of the second photoresist; (e2) forming a second organic functional layer including a second emission layer on the second primary electrode and the fourth portion of the second photoresist; and (f2) removing remaining portions of the second lift-off layer, the second barrier layer, the second photoresist, and the second organic functional layer disposed on the fourth portion of the second photoresist.

Light emitted from the first emission layer and light emitted from the second emission layer may have different colors from each other.

The step d1 and step d2 may include wet etching using a first solvent including fluorine.

A second solvent including fluorine may be used in the step f1 and step f2.

The secondary electrode may be integrally formed on the first and second organic functional layers as a common electrode.

The method may further include forming auxiliary cathodes during the step e1 and the step e2 before the forming of the second electrode.

The method may further include forming pixel-defining layers surrounding edges of the first primary electrode and the second primary electrode.

According to one or more exemplary embodiments, an organic light-emitting display apparatus is manufactured by the method described above.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
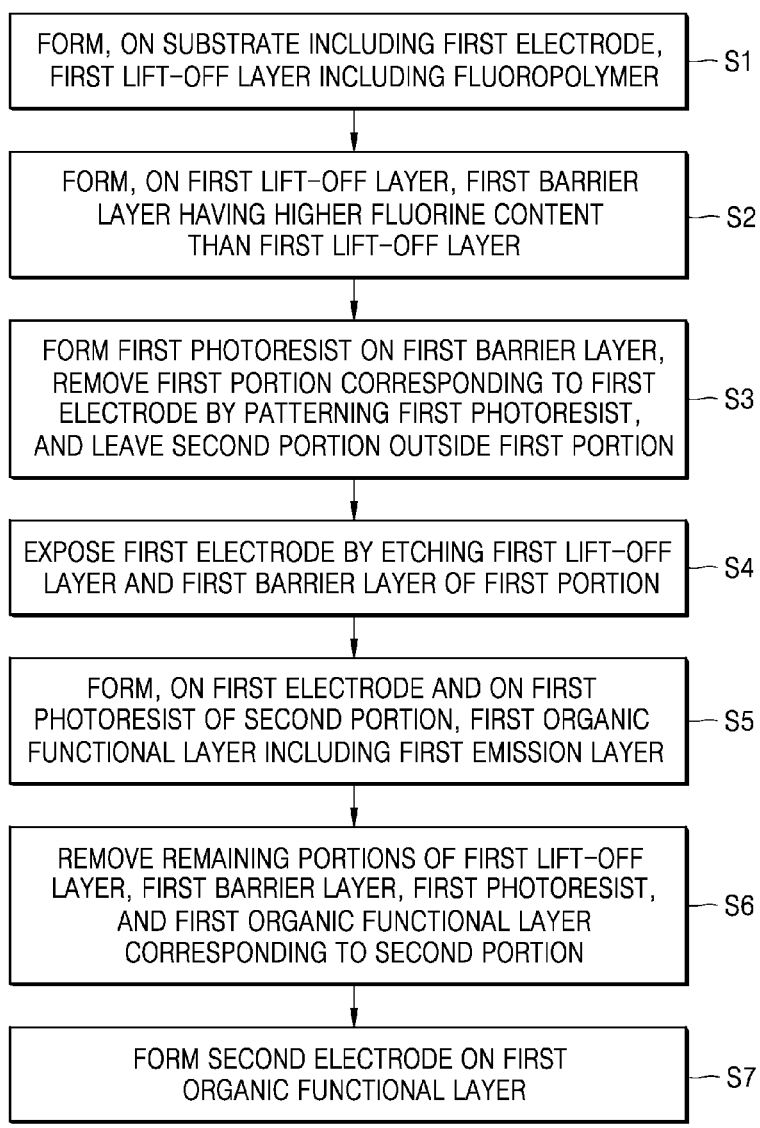
FIG. 1 is a flowchart of a manufacturing method of an organic light-emitting display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein. The numbering of the exemplary embodiments as first, second, and third, etc. is merely for convenience and not a limitation on the number or type of embodiments that may be constructed according to the principles of the invention.

FIG. 1 is a schematic flowchart of a manufacturing method of an organic light-emitting display apparatus, according to an exemplary embodiment.

Referring to FIG. 1, a method of manufacturing an organic light-emitting display apparatus, according to the present exemplary embodiment, includes: an operation (S1) of forming, on a substrate including a first electrode, a first lift-off layer including a fluoropolymer; an operation (S2) of forming, on the first lift-off layer, a first barrier layer having a higher fluorine content than the first lift-off layer; an operation (S3) of forming a first photoresist on the first barrier layer, removing a first portion corresponding to the first electrode by patterning the first photoresist, and leaving a second portion outside the first portion; an operation (S4) of exposing the first electrode by etching the first lift-off layer and the first barrier layer of the first portion; an operation (S5) of forming, on the first electrode and on the first photoresist of the second portion, a first organic functional layer including a first emission layer; an operation (S6) of removing remaining portions of the first lift-off layer, the first barrier layer, the first photoresist, and the first organic functional layer corresponding to the second portion; and an operation (S7) of forming a second electrode on the first organic functional layer.

A method of manufacturing an organic light-emitting display apparatus, according to a first exemplary embodiment, and an organic light-emitting display apparatus 1 manufactured by the manufacturing method will be described in detail with reference to FIGS. 2 to 6E.

Figure 2:
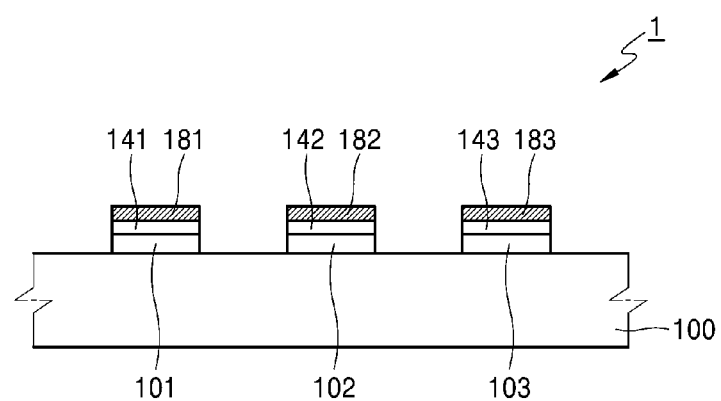
FIG. 2 is a schematic cross-sectional view of an organic light-emitting display apparatus manufactured by a manufacturing method according to a first exemplary embodiment.
Figure 3:
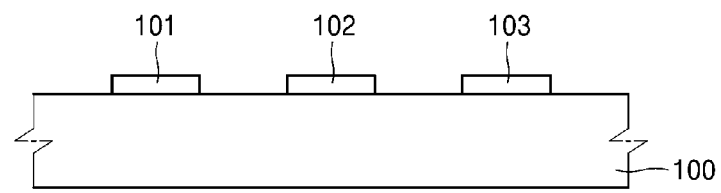
FIG. 3 is a schematic cross-sectional view of a plurality of anodes formed on a substrate by the manufacturing method according to the first exemplary embodiment.

FIG. 2 is a schematic cross-sectional view of the organic light-emitting display apparatus 1 manufactured by the manufacturing method according to the first exemplary embodiment. FIG. 3 is a schematic cross-sectional view of a plurality of anodes, for example, first, second, and third anodes 101, 102, and 103, formed on a substrate 100 by the manufacturing method according to the first exemplary embodiment. FIGS. 4A to 4E are schematic cross-sectional views of a first unit process of the manufacturing method according to the first exemplary embodiment. FIGS. 5A to 5E are schematic cross-sectional views of a second unit process of the manufacturing method according to the first exemplary embodiment. FIGS. 6A to 6E are schematic cross-sectional views of a third unit process of the manufacturing method according to the first exemplary embodiment.

Referring to FIG. 2, the organic light-emitting display apparatus 1 manufactured by the manufacturing method according to the first exemplary embodiment includes a plurality of anodes including first, second, and third anodes 101, 102, and 103 on the substrate 100. First, second, and third organic functional layers 141, 142, and 143, each including an emission layer, are disposed on the first to third anodes 101 to 103, respectively. First, second, and third auxiliary cathodes 181, 182, and 183 are disposed on the first to third organic functional layers 141 to 143, respectively.

More particularly, a plurality of anodes including the first anode 101, the second anode 102, and the third anode 103 are formed on the substrate 100, as shown in FIG. 3. The substrate 100 may include various materials. For example, the substrate 100 may include glass or plastic. The plastic may include a material having excellent heat resistance properties and durability, such as polyimide, polyethylene naphthalate, polyethylene terephthalate, polyarylate, polycarbonate, polyetherimide, or polyethersulfone.

Although not illustrated in FIG. 3, a buffer layer (not shown) that provides a flat surface may be formed on the substrate 100, which may prevent impurities from infiltrating into the substrate 100. The buffer layer (not shown) may be a single layer or a plurality of layers including silicon nitride and/or silicon oxide.

The first to third anodes 101, 102, and 103 are hole injection electrodes and may include a material having a high work function. The first to third anodes 101 to 103 may each include at least one selected of indium tin oxide, indium zinc oxide, zinc oxide, indium oxide, indium gallium oxide, and aluminum zinc oxide. Also, each of the first to third anodes 101 to 103 may be a single layer or a plurality of layers including metal, such as silver (Ag), aluminum, magnesium, lithium, calcium, etc., and/or an alloy thereof Although not illustrated in FIG. 3, the first to third anodes 101 to 103 may be electrically connected to first to third thin film transistors (not shown), respectively. The first to third thin film transistors (not shown) may be disposed between the substrate 100 and the first to third anodes 101 to 103.

Figure 4A:
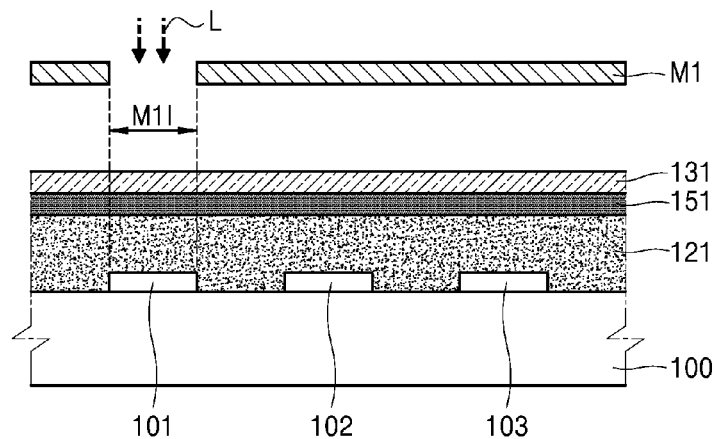
FIG. 4A, FIG. 4B, FIG. 4C, FIG. 4D, and FIG. 4E are schematic cross-sectional views of a first unit process of the manufacturing method according to the first exemplary embodiment.

Referring to FIG. 4A, a first lift-off layer 121 including a fluoropolymer, a first barrier layer 151, and a first photoresist 131 are sequentially formed on the substrate 100 formed with the first to third anodes 101 to 103.

The fluoropolymer in the first lift-off layer 121 may include a polymer containing about 20 wt % to about 60 wt % of fluorine. For example, the fluoropolymer in the first lift-off layer 121 may include at least one of polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

The first lift-off layer 121 may be formed on the substrate 100 by using an application method, a printing method, a deposition method, or the like. When the first lift-off layer 121 is formed by an application method or a printing method, the first barrier layer 151 and the first photoresist 131 may be formed after performing a hardening process and a polymerization process, if necessary.

A thickness of the first lift-off layer 121 may be about 0.2 μm to about 5 μm. When the first lift-off layer 121 is too thick, melting the first lift-off layer 121 for patterning may take longer, which may increase manufacturing process time. When the first lift-off layer 121 is too thin, it is difficult to lift off the first lift-off layer 121.

The first barrier layer 151 is formed on the first lift-off layer 121. Propylene glycol methyl ether acetate (PGMEA) may be used as a solvent of the first photoresist 131, which may diffuse into the first lift-off layer 121 and accelerate degradation of a first organic functional layer 141, which will be described in more detail later. In the present exemplary embodiment, the first barrier layer 151 has a higher fluorine content than the first lift-off layer 121, such that impurities of the first photoresist 131, which will be described later, may be prevented from diffusing into the first lift-off layer 121.

The first barrier layer 151 may contain about 40 wt % to about 76 wt % of fluorine.

The first photoresist 131 is formed on the first barrier layer 151. A portion of the first photoresist 131, which is disposed at a location corresponding to the first anode 101, is exposed to light via a region M1l of a first photomask M1 that transmits light L. Then, the exposed first photoresist 131 is developed.

Figure 4B:
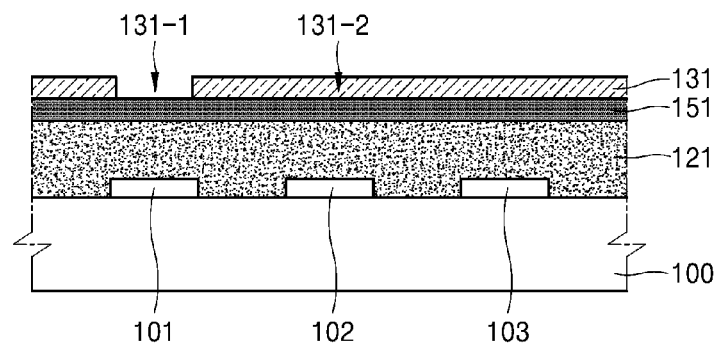

Referring to FIG. 4B, the first photoresist 131 has a patterned shape. A first portion 131-1 of the first photoresist 131, which is disposed at a location corresponding to the first anode 101, is removed by exposure and development, and a second portion 131-2, which is the rest of the first photoresist 131, remains on the first barrier layer 151.

Figure 4C:
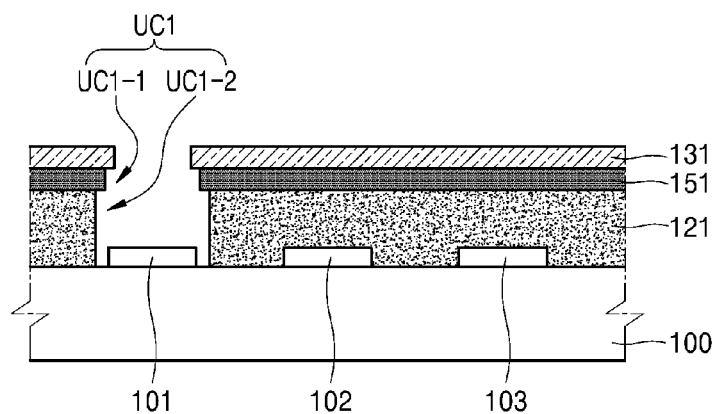

Referring to FIG. 4C, the first barrier layer 151 and the first lift-off layer 121 are etched by using a pattern of the first photoresist 131 of FIG. 4B as an etching mask. Because each of the first barrier layer 151 and the first lift-off layer 121 includes a fluoropolymer, a solvent capable of etching the fluoropolymer may be used as an etchant.

A first solvent including fluorine may be used as the etchant. The first solvent may include hydrofluoroether. The hydrofluoroether has low reactivity with another material, and is thus electrochemically stable. Also, the hydrofluoroether has a low global warming potential and low toxicity, and is thus environmentally stable.

By the etching process, portions of the first barrier layer 151 and the first lift-off layer 121 that are disposed in a location corresponding to the first portion 131-1 (or overlapping the first anode 101) are etched.

When the first barrier layer 151 and the first lift-off layer 121 are etched, the first solvent including fluorine forms a 1-1 undercut profile UC1-1 in the first barrier layer 151, which is under a boundary surface of the first portion 131-1 of the first photoresist 131, and forms a 1-2 undercut profile UC1-2 in the first lift-off layer 121, which is under a boundary surface of the first barrier layer 151.

Shapes of the 1-1 undercut profile UC1-1 and the 1-2 undercut profile UC1-2 shown in FIG. 4C are not limited thereto, and may be varied according to a difference in the dissolution rates of the first barrier layer 151 and the first lift-off layer 121 by the first solvent.

Figure 10:
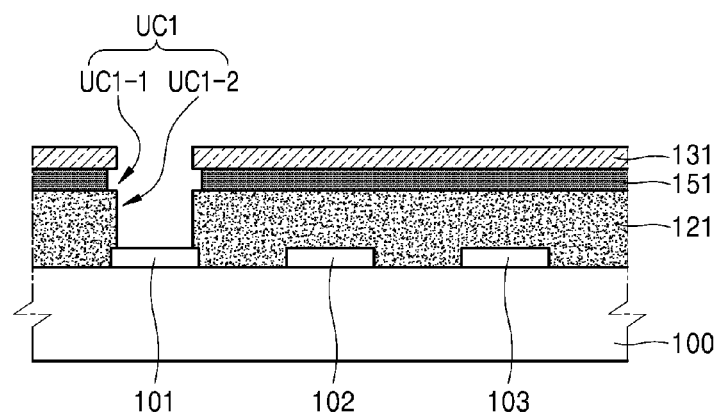
FIG. 10 is a cross-sectional view of an example of first and second undercut profiles.

In FIG. 4C, the 1-2 undercut profile UC1-2 is formed wider than the 1-1 undercut profile UC1-1 with respect to an etched surface of the first photoresist 131, because the dissolution rate of the first lift-off layer 121 is higher than the dissolution rate of the first barrier layer 151. However, as illustrated in FIG. 10, which will be described later, the 1-1 undercut profile UC1-1 may be formed wider than the 1-2 undercut profile UC1-2 with respect to an etched surface of the first photoresist 131, because the dissolution rate of the first barrier layer 151 is higher than the dissolution rate of the first lift-off layer 121.

The first undercut profiles UC1-1 and UC1-2 may allow a sophisticated deposition pattern on the first organic functional layer 141 that is to be formed during a deposition process, and allow thorough removal of the first lift-off layer 121 that remains on the substrate 100 during a first lift-off process.

Figure 4D:
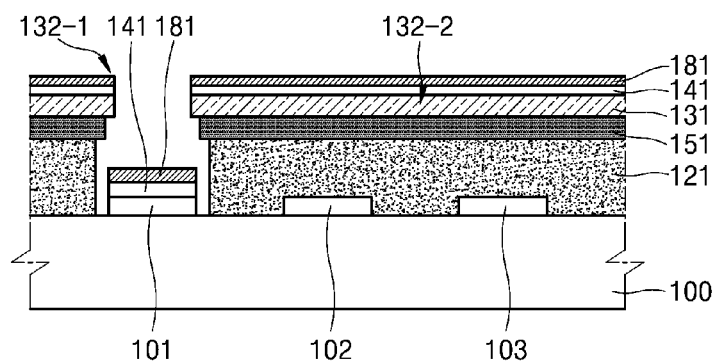

Referring to FIG. 4D, the first organic functional layer 141 including a first emission layer (not shown) and the first auxiliary cathode 181 are sequentially formed on the structure of FIG. 4C.

The first organic functional layer 141 may further include at least one functional layer from among a hole injection layer, a hole transport layer, an electron transport layer, and an electron injection layer.

The first organic functional layer 141 may be formed by vacuum deposition. In the deposition process, the first barrier layer 151, the first lift-off layer 121, and the first photoresist 131 serve as a deposition mask. One portion of the first organic functional layer 141 is formed in a location corresponding to the first portion 131-1 (or overlapping the first anode 101), and the other portion of the first organic functional layer 141 is formed on the second portion 131-2 of the first photoresist 131.

Similarly, the first auxiliary cathode 181 may be formed by vacuum deposition. In the deposition process, the first barrier layer 151, the first lift-off layer 121, and the first photoresist 131 serve as a deposition mask. One portion of the first auxiliary cathode 181 is formed to cover an upper surface of the first organic functional layer 141. In addition, the other portion of the first auxiliary cathode 181 is formed on the first organic functional layer 141 over the second portion 131-2, which is the rest of the first photoresist 131 excluding the first portion 131-1.

The first auxiliary cathode 181 may include the same material as a cathode 180 serving as a common electrode, which will be described later. In some exemplary embodiments, the first auxiliary cathode 181 may include a material different from that of the cathode 180. The first auxiliary cathode 181 may serve as a barrier that protects the first organic functional layer 141 from a solvent used in a lift-off process, which will be described later.

Figure 4E:
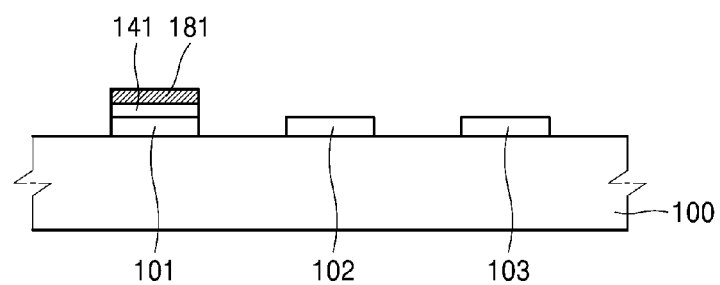

Referring to FIG. 4E, a lift-off process is performed on the structure of FIG. 4D.

Because each of the first barrier layer 151 and the first lift-off layer 121 includes a fluoropolymer, a second solvent including fluorine is used in the lift-off process. The lift-off process is performed after the first organic functional layer 141 is formed, and accordingly, a material having low reactivity with the first organic functional layer 141 may be used as the second solvent. As the first solvent includes hydrofluoroether, the second solvent may include, for example, hydrofluoroether.

By lifting off the first lift-off layer 121 formed under the second portion 131-2 (refer to FIG. 4D) of the first photoresist 131, portions of the first organic functional layer 141 and the first auxiliary cathode 181 formed on the second portion 131-2 (refer to FIG. 4D) of the first photoresist 131 are removed, and portions of the first organic functional layer 141 and the first auxiliary cathode 181 formed on the first anode 101 remain as a pattern.

After the first unit process is performed, the second unit process for forming the second organic functional layer 142 (refer to FIG. 5D) emitting light of a different color from that in the first organic functional layer 141 is performed in a region where the second anode 102 is disposed. Hereinafter, the second unit process will be described with reference to FIGS. 5A to 5E.

Figure 5A:
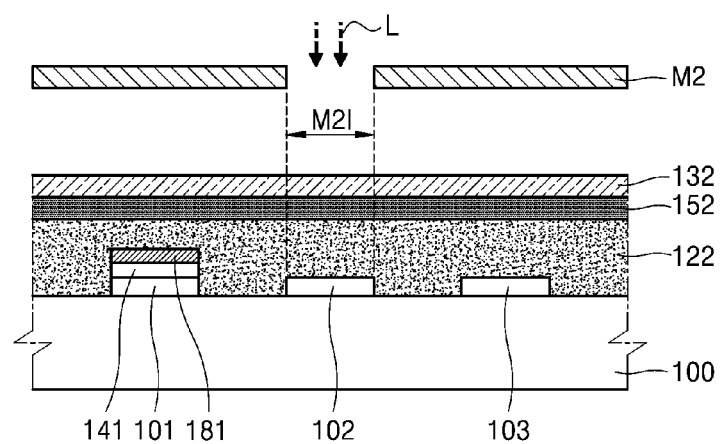
FIG. 5A, FIG. 5B, FIG. 5C, FIG. 5D, and FIG. 5E are schematic cross-sectional views of a second unit process of the manufacturing method according to the first exemplary embodiment.

Referring to FIG. 5A, a second lift-off layer 122 including a fluoropolymer, a second barrier layer 152, and a second photoresist 132 are sequentially formed on the structure of FIG. 4E.

The fluoropolymer in the second lift-off layer 122 may include a polymer containing about 20 wt % to about 60 wt % of fluorine. The second lift-off layer 122 may include the same or different material from that of the first lift-off layer 121. The second lift-off layer 122 may be formed by using an application method, a printing method, a deposition method, or the like.

The second barrier layer 152 has a higher fluorine content than the second lift-off layer 122, such that impurities of the second photoresist 132, which will be described later, may be prevented from diffusing into the second lift-off layer 122. PGMEA, which may be used as a solvent of the second photoresist 132, may diffuse into the second lift-off layer 122 and accelerate degradation of the second organic functional layer 142.

The second barrier layer 152 may contain about 40 wt % to about 76 wt % of fluorine.

The second photoresist 132 is formed on the second barrier layer 152. A portion of the second photoresist 132 that is disposed at a location corresponding to the second anode 102 is exposed to light via a region M2l of a second photomask M2 that transmits light L. Then, the exposed second photoresist 132 is developed.

Figure 5B:
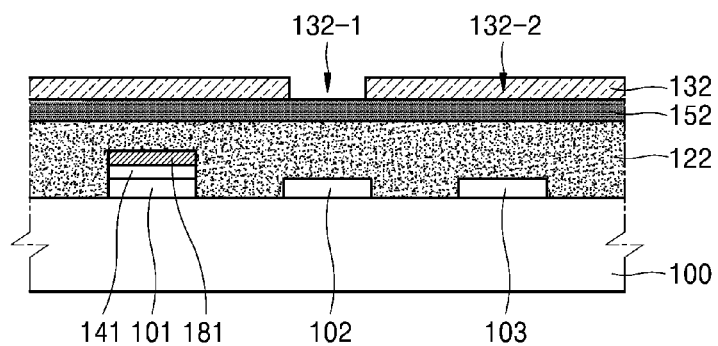

Referring to FIG. 5B, the second photoresist 132 has a patterned shape. A first portion 132-1 of the second photoresist 132, which is disposed at a location corresponding to the second anode 102, is removed by exposure and development, and a second portion 132-2, which is the rest of the second photoresist 132, remains on the second barrier layer 152.

Figure 5C:
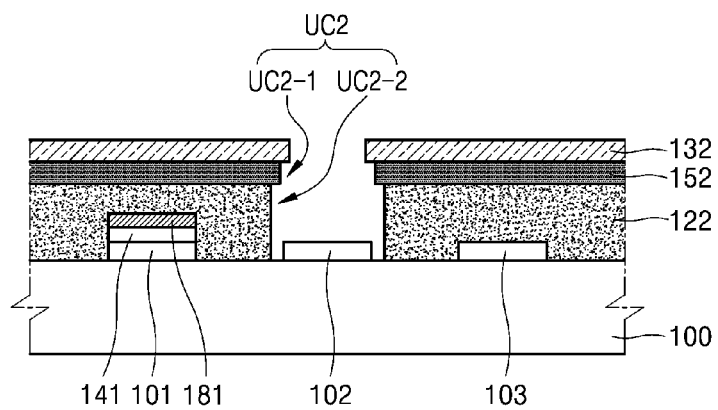

Referring to FIG. 5C, the second barrier layer 152 and the second lift-off layer 122 are etched by using a pattern of the second photoresist 132 of FIG. 5B as an etching mask. Because each of the second barrier layer 152 and the second lift-off layer 122 includes a fluoropolymer, a solvent capable of etching the fluoropolymer may be used as an etchant.

A first solvent including fluorine may be used as the etchant. The first solvent may include, for example, hydrofluoroether. The hydrofluoroether has low reactivity with another material, and is thus electrochemically stable. Also, the hydrofluoroether has a low global warming potential and low toxicity, and is thus environmentally stable.

By the etching process, portions of the second barrier layer 152 and the second lift-off layer 122, which are formed in a location corresponding to the first portion 132-1 (or overlapping the second anode 102) are etched.

When the second barrier layer 152 and the second lift-off layer 122 are etched, the first solvent including fluorine forms a 2-1 undercut profile UC2-1 in the second barrier layer 152, which is under a boundary surface of the first portion 132-1 of the second photoresist 132, and forms a 2-2 undercut profile UC2-2 in the second lift-off layer 122, which is under a boundary surface of the second barrier layer 152.

Figure 5D:
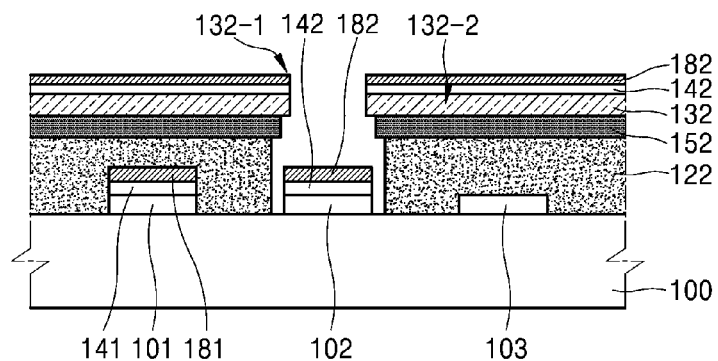

Referring to FIG. 5D, the second organic functional layer 142 including a second emission layer (not shown) and the second auxiliary cathode 182 are sequentially formed on the structure of FIG. 5C.

The second organic functional layer 142 may further include at least one functional layer among a hole injection layer, a hole transport layer, an electron transport layer, and an electron injection layer.

The second organic functional layer 142 may be formed by vacuum deposition. In the deposition process, the second barrier layer 152, the second lift-off layer 122, and the second photoresist 132 serve as a deposition mask. One portion of the second organic functional layer 142 is formed in a location corresponding to the first portion 132-1 (or overlapping the second anode 102), and the other portion of the second organic functional layer 142 is formed on the second portion 132-2 of the second photoresist 132.

Similarly, the second auxiliary cathode 182 may be formed by vacuum deposition. In the deposition process, the second barrier layer 152, the second lift-off layer 122, and the second photoresist 132 serve as a deposition mask. One portion of the second auxiliary cathode 182 is formed to cover an upper surface of the second organic functional layer 142. In addition, the other portion of the second auxiliary cathode 182 is formed on the second organic functional layer 142 over the second portion 132-2, which is the rest of the second photoresist 132 minus the first portion 132-1.

Figure 5E:
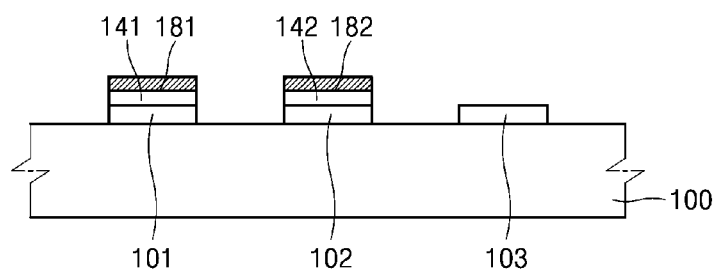

Referring to FIG. 5E, a lift-off process is performed on the structure of FIG. 5D.

Because each of the second barrier layer 152 and the second lift-off layer 122 includes a fluoropolymer, a second solvent including fluorine may be used in the lift-off process. The lift-off process is performed after the second organic functional layer 142 is formed, and accordingly, a material having low reactivity with the second organic functional layer 142 may be used as the second solvent. As the first solvent includes hydrofluoroether, the second solvent may include, for example, hydrofluoroether.

By lifting off the second lift-off layer 122 formed under the second portion 132-2 (refer to FIG. 5D) of the second photoresist 132, portions of the second organic functional layer 142 and the second auxiliary cathode 182 that are formed on the second portion 132-2 (refer to FIG. 5D) of the second photoresist 132 are removed, and portions of the second organic functional layer 142 and the second auxiliary cathode 182 that are formed on the second anode 102 remain on the second anode 102 as a pattern.

After the second unit process is performed, the third unit process for forming the third organic functional layer 143 emitting light of a color different from that emitted in the first organic functional layer 141 and the second organic functional layer 142 is performed in a region where the third anode 103 is located. Hereinafter, the third unit process will be described with reference to FIGS. 6A to 6E.

Figure 6A:
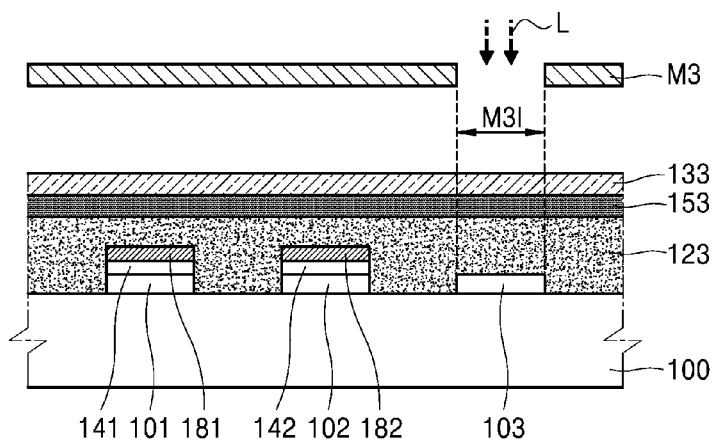
FIG. 6A, FIG. 6B, FIG. 6C, FIG. 6D, and FIG. 6E are schematic cross-sectional views of a third unit process of the manufacturing method according to the first exemplary embodiment.

Referring to FIG. 6A, a third lift-off layer 123 including a fluoropolymer, a third barrier layer 153, and a third photoresist 133 are sequentially formed on the structure of FIG. 5E.

The fluoropolymer in the third lift-off layer 123 may include a polymer containing about 20 wt % to about 60 wt % of fluorine. The third lift-off layer 123 may include the same or different material from that of the second lift-off layer 122. The third lift-off layer 123 may be formed by using an application method, a printing method, a deposition method, or the like.

The third barrier layer 153 has a higher fluorine content than the third lift-off layer 123, such that impurities of the third photoresist 133, which will be described later, may be prevented from diffusing into the third lift-off layer 123.

The third barrier layer 153 may contain about 40 wt % to about 76 wt % of fluorine.

The third photoresist 133 is formed on the third barrier layer 153. A portion of the third photoresist 133 disposed at a location corresponding to the third anode 103 is exposed to light via a region M31 of a third photomask M3 that transmits light L. Then, the exposed third photoresist 133 is developed.

Figure 6B:
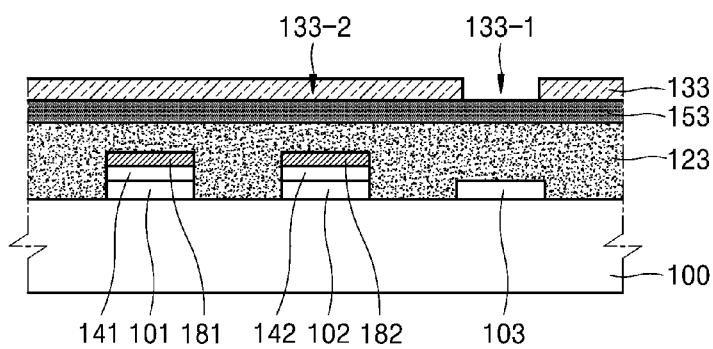

Referring to FIG. 6B, the third photoresist 133 has a patterned shape. A first portion 133-1 of the third photoresist 133, which is disposed at a location corresponding to the third anode 103, is removed by exposure and development, and a second portion 133-2, which is the rest of the third photoresist 133, remains on the third barrier layer 153.

Figure 6C:
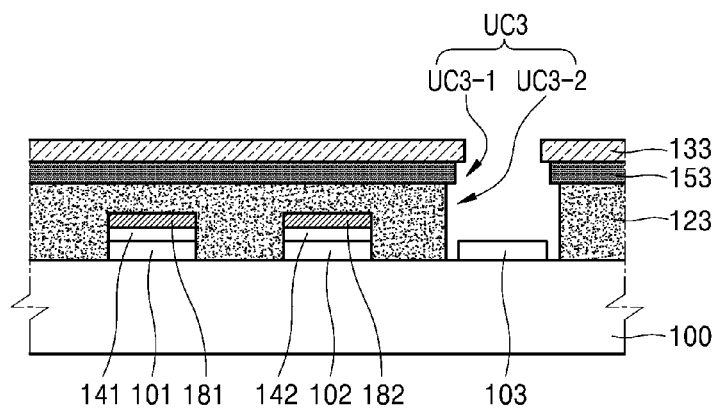

Referring to FIG. 6C, the third barrier layer 153 and the third lift-off layer 123 are etched by using a pattern of the third photoresist 133 of FIG. 6B as an etching mask. Because each of the third barrier layer 153 and the third lift-off layer 123 includes a fluoropolymer, a solvent capable of etching the fluoropolymer may be used as an etchant.

A first solvent including fluorine may be used as the etchant. The first solvent may include, for example, hydrofluoroether. The hydrofluoroether has low reactivity with another material, and is thus electrochemically stable. Also, the hydrofluoroether has a low global warming potential and low toxicity, and is thus environmentally stable.

By the etching process, portions of the third barrier layer 153 and the third lift-off layer 123, which are formed in a location corresponding to the first portion 133-1 (or overlapping the third anode 103) are etched.

When the third barrier layer 153 and the third lift-off layer 123 are etched, the first solvent including fluorine forms a 3-1 undercut profile UC3-1 in the third barrier layer 153, which is under a boundary surface of the first portion 133-1 of the third photoresist 133, and forms a 3-2 undercut profile UC3-2 in the third lift-off layer 123, which is under a boundary surface of the third barrier layer 153.

Figure 6D:
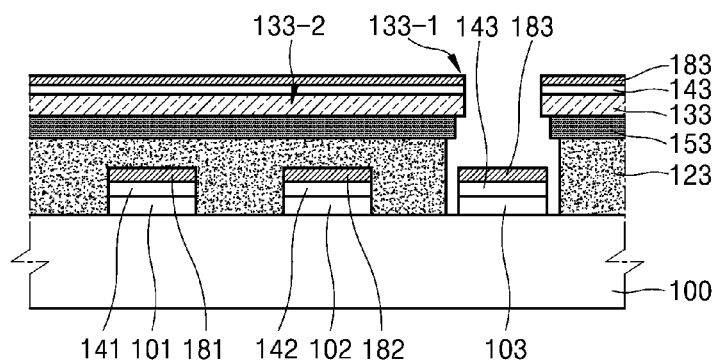

Referring to FIG. 6D, the third organic functional layer 143 including a third emission layer (not shown) and the third auxiliary cathode 183 are sequentially formed on the structure of FIG. 6C.

The third organic functional layer 143 may further include at least one functional layer among a hole injection layer, a hole transport layer, an electron transport layer, and an electron injection layer.

The third organic functional layer 143 may be formed by vacuum deposition. In the deposition process, the third barrier layer 153, the third lift-off layer 123, and the third photoresist 133 serve as a deposition mask. One portion of the third organic functional layer 143 is formed in a location corresponding to the first portion 133-1 (or overlapping the third anode 103), and the other portion of the third organic functional layer 143 is formed on the second portion 133-2 of the third photoresist 133.

Similarly, the third auxiliary cathode 183 may be formed by vacuum deposition. In the deposition process, the third barrier layer 153, the third lift-off layer 123, and the third photoresist 133 serve as a deposition mask. One portion of the third auxiliary cathode 183 is formed to cover an upper surface of the third organic functional layer 143. In addition, the other portion of the third auxiliary cathode 183 is formed on the third organic functional layer 143 over the second portion 133-2, which is the rest of the third photoresist 133 minus the first portion 133-1.

Figure 6E:
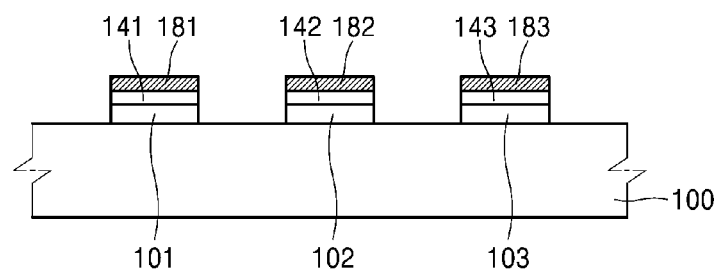

Referring to FIG. 6E, a lift-off process is performed on the structure of FIG. 6D. Because each of the third barrier layer 153 and the third lift-off layer 123 includes a fluoropolymer, a second solvent including fluorine may be used in the lift-off process. The lift-off process is performed after the third organic functional layer 143 is formed, and accordingly, a material having low reactivity with the third organic functional layer 143 may be used as the second solvent. As the first solvent includes hydrofluoroether, the second solvent may include, for example, hydrofluoroether.

By lifting off the third lift-off layer 123 formed under the second portion 133-2 (refer to FIG. 6D) of the third photoresist 133, portions of the third organic functional layer 143 and the third auxiliary cathode 183 that are formed on the second portion 133-2 (refer to FIG. 6D) of the third photoresist 133 are removed, and portions of the third organic functional layer 143 and the third auxiliary cathode 183 that are formed on the third anode 103 remain on the third anode 103 as a pattern.

In the present exemplary embodiment, the first to third anodes 101 to 103 are hole injection electrodes, and the first to third auxiliary cathodes 181 to 183 are electron injection electrodes. However, the present invention is not limited thereto, and an electron injection electrode may be formed in a region where the first to third anodes 101 to 103 are disposed, and a hole injection electrode may be formed in a region where the first to third auxiliary cathodes 181 to 183 are disposed.

The first to third organic functional layers 141 to 143 may emit light of different colors from one another. Light emitted from the first to third organic functional layers 141 to 143 may be mixed to form white light. For example, the first to third organic functional layers 141 to 143 may emit red light, green light, and blue light, respectively. The first to third organic functional layers 141 to 143 may be elements of sub-pixels constituting a unit pixel of the organic light-emitting display apparatus 1.

The organic light-emitting display apparatus 1 of FIG. 2 may correspond to one unit pixel. Also, the present exemplary embodiment may be applied to an organic light-emitting display apparatus including the unit pixel of FIG. 2 as a plurality of unit pixels. That is, a plurality of first organic functional layers 141 emitting a first color of light may be simultaneously formed as a first group via the first unit process. A plurality of second organic functional layers 142 emitting a second color of light may be simultaneously formed as a second group via the second unit process. A plurality of third organic functional layers 143 emitting a third color of light may be simultaneously formed as a third group via the third unit process. Accordingly, through the first to third unit processes, full color may be implemented.

Hereinafter, the present exemplary embodiment will be described in comparison with a method of manufacturing an organic light-emitting display apparatus, according to a comparative embodiment of FIGS. 7A to 9E.

FIGS. 7A to 7E are schematic cross-sectional views of a first unit process of a manufacturing method according to a comparative embodiment. FIGS. 8A to 8E are schematic cross-sectional views of a second unit process of the manufacturing method according to the comparative embodiment. FIGS. 9A to 9E are schematic cross-sectional views of a third unit process of the manufacturing method according to the comparative embodiment.

Figure 7A:
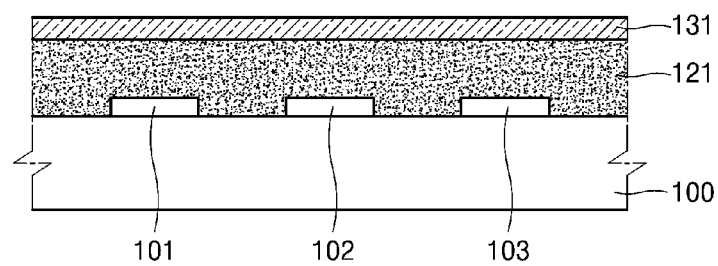
FIG. 7A, FIG. 7B, FIG. 7C, FIG. 7D, and FIG. 7E are schematic cross-sectional views of a first unit process of a manufacturing method according to a comparative embodiment.

Referring to FIG. 7A, the first lift-off layer 121 including a fluoropolymer is formed on the substrate 100, on which the first to third anodes 101 to 103 are formed thereon. The first photoresist 131 is then formed on the first lift-off layer 121.

Figure 7B:
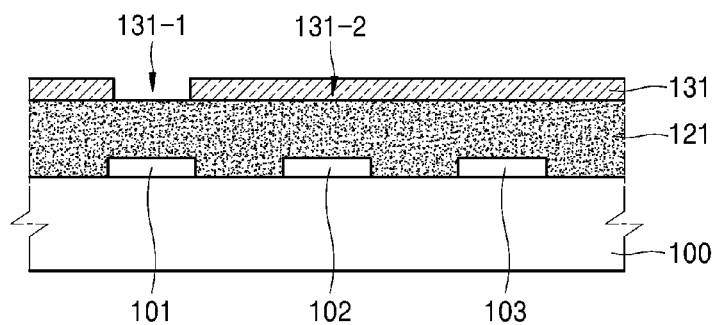

Referring to FIG. 7B, the first photoresist 131 has a patterned shape. The first portion 131-1 of the first photoresist 131, which is disposed at a location corresponding to the first anode 101, is removed by exposure and development, and the second portion 131-2 of the first photoresist 131, which is a region outside the first portion 131-1, remains on the first lift-off layer 121.

Figure 7C:
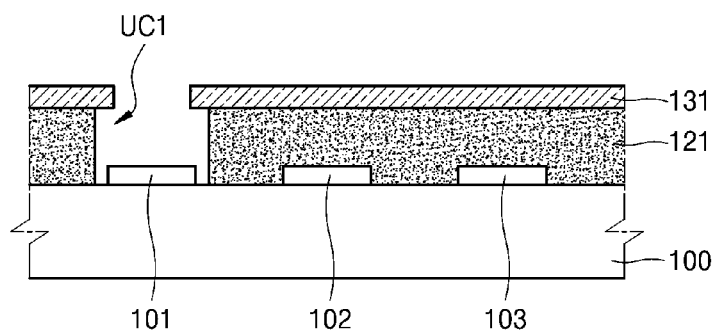

Referring to FIG. 7C, by using a pattern of the first photoresist 131 of FIG. 7B as an etching mask, the first lift-off layer 121 is etched by using a first solvent including fluorine. By the etching process, a portion of the first lift-off layer 121, which is formed in a location corresponding to the first portion 131-1 (or overlapping the first anode 101) is etched. A first undercut profile UC1 is formed in the first lift-off layer 121 under a boundary surface of the first portion 131-1 of the first photoresist 131.

Figure 7D:
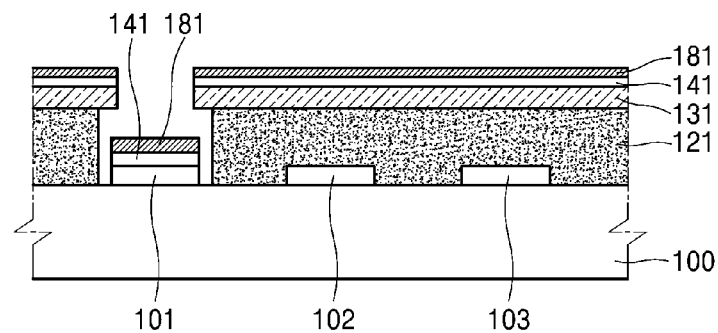

Referring to FIG. 7D, the first organic functional layer 141 and the first auxiliary cathode 181 are sequentially formed on the structure of FIG. 7C.

Figure 7E:
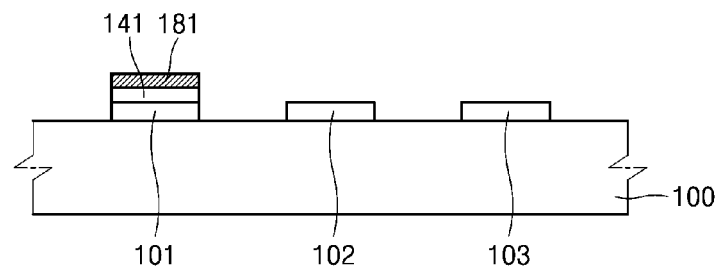

Referring to FIG. 7E, a first lift-off process is performed to entirely remove the remaining first lift-off layer 121, and as a result, portions of the first organic functional layer 141 and the first auxiliary cathode 181 remain on the first anode 101 as a pattern.

After the first unit process is completed, the second unit process is performed on a region where the second anode 102 is located.

Figure 8A:
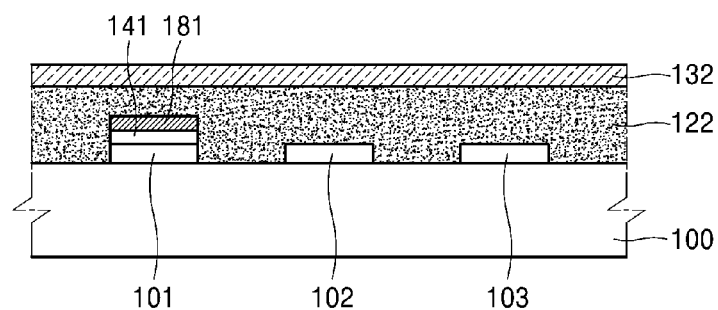
FIG. 8A, FIG. 8B, FIG. 8C, FIG. 8D, and FIG. 8E are schematic cross-sectional views of a second unit process of the manufacturing method according to the comparative embodiment.

Referring to FIG. 8A, the second lift-off layer 122 and the second photoresist 132 are sequentially formed on the structure of FIG. 7E.

Figure 8B:
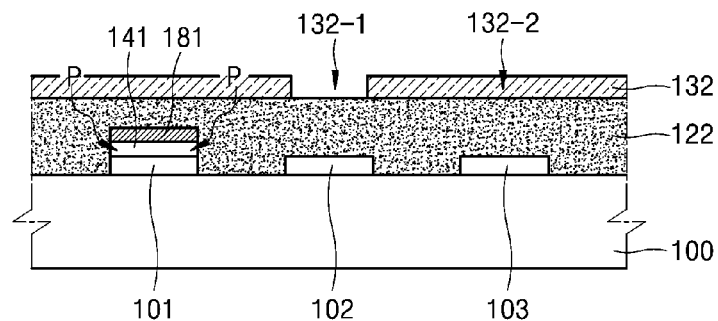

Referring to FIG. 8B, the second photoresist 132 is patterned by exposure and development, such that the first portion 132-1 of the second photoresist 132, which is disposed at a location corresponding to the second anode 102, may be removed, and the second portion 132-2 of the second photoresist 132, which is a region outside the first portion 132-1, may remain on the second lift-off layer 122.

The second lift-off layer 122 includes a fluoropolymer. Although the fluoropolymer has low reactivity with another material, and is thus electrochemically stable, however, PGMEA (P) included in the second photoresist 132 may diffuse into the second lift-off layer 122 and accelerate degradation of the first organic functional layer 141.

Figure 8C:
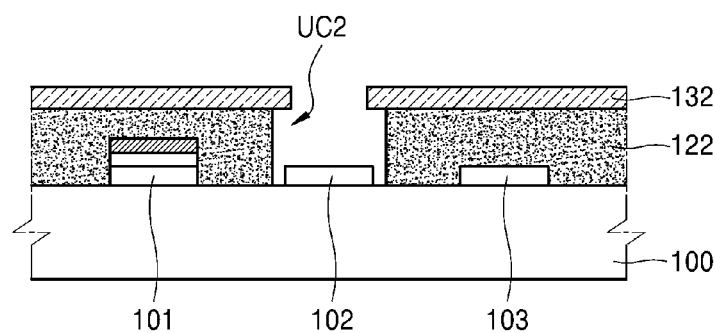

Referring to FIG. 8C, by using a pattern of the second photoresist 132 of FIG. 8B as an etching mask, the second lift-off layer 122 is etched by using the first solvent including fluorine. By the etching process, a portion of the second lift-off layer 122, which is formed in a location corresponding to the first portion 132-1 (or overlapping the second anode 102) is etched. A second undercut profile UC2 is formed in the second lift-off layer 122 under a boundary surface of the first portion 132-1 of the second photoresist 132.

Figure 8D:
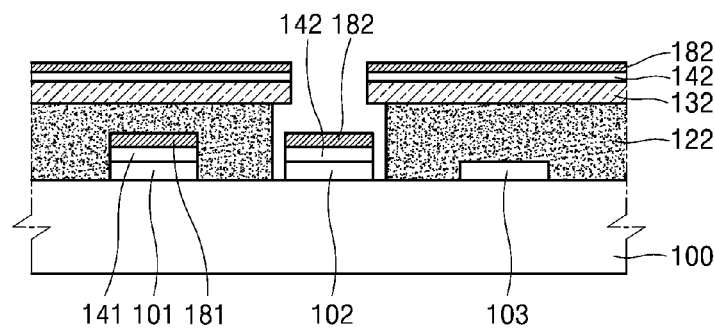

Referring to FIG. 8D, the second organic functional layer 142 and the second auxiliary cathode 182 are sequentially formed on the structure of FIG. 8C.

Figure 8E:
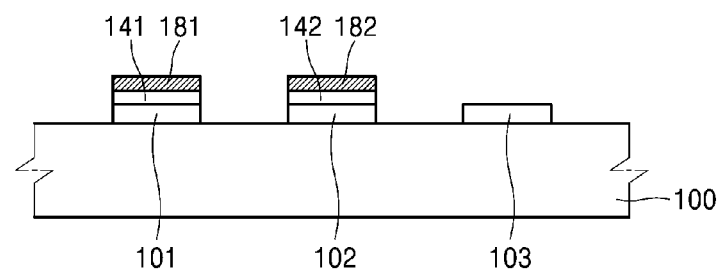

Referring to FIG. 8E, a second lift-off process is performed to entirely remove the remaining second lift-off layer 122. Accordingly, portions of the first organic functional layer 141 and the first auxiliary cathode 181 remain on the first anode 101, and portions of the second organic functional layer 142 and the second auxiliary cathode 182 remain on the second anode 102, as patterns.

After the second unit process is completed, the third unit process is performed on a region where the third anode 103 is located.

Figure 9A:
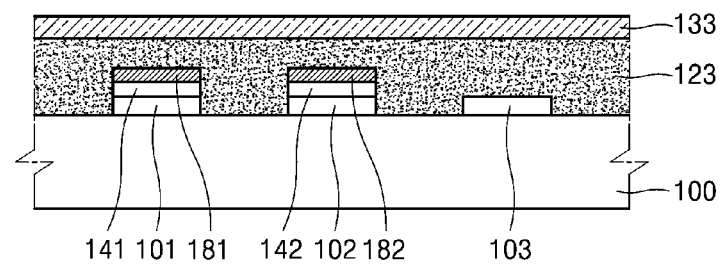
FIG. 9A, FIG. 9B, FIG. 9C, FIG. 9D, and FIG. 9E are schematic cross-sectional views of a third unit process of the manufacturing method according to the comparative embodiment.

Referring to FIG. 9A, the third lift-off layer 123 and the third photoresist 133 are sequentially formed on the structure of FIG. 8E.

Figure 9B:
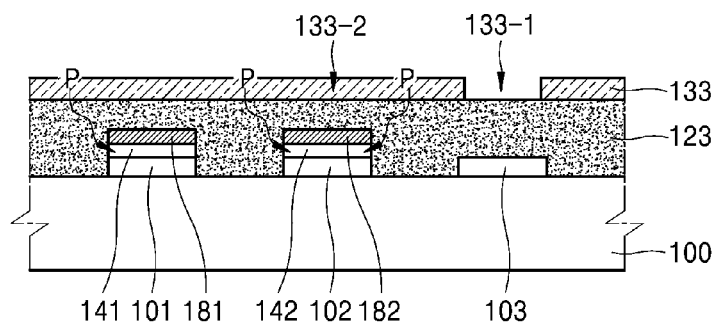

Referring to FIG. 9B, the third photoresist 133 is patterned by exposure and development, such that the first portion 133-1 of the third photoresist 133, which is disposed at a location corresponding to the third anode 103, may be removed, and the second portion 133-2 of the third photoresist 133, which is a region outside the first portion 133-1, may remain on the third lift-off layer 123.

The third lift-off layer 123 includes a fluoropolymer. Although the fluoropolymer has low reactivity with another material, and is thus electrochemically stable, PGMEA (P) included in the third photoresist 133 may diffuse into the third lift-off layer 123 and accelerate degradation of the first organic functional layer 141 and the second organic functional layer 142.

Figure 9C:
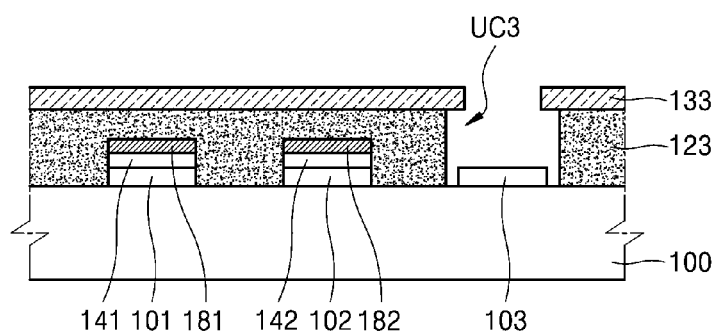

Referring to FIG. 9C, by using a pattern of the third photoresist 133 of FIG. 9B as an etching mask, the third lift-off layer 123 is etched by using the first solvent including fluorine. By the etching process, a portion of the third lift-off layer 123, which is formed in a location corresponding to the first portion 133-1 (or overlapping the third anode 103) is etched. A third undercut profile UC3 is formed in the third lift-off layer 123 under a boundary surface of the first portion 133-1 of the third photoresist 133.

Figure 9D:
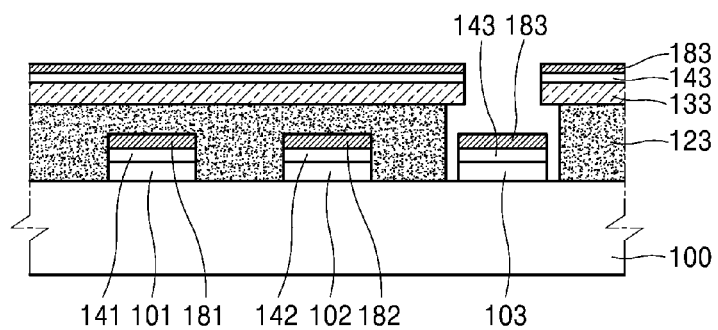

Referring to FIG. 9D, the third organic functional layer 143 and the third auxiliary cathode 183 are sequentially formed on the structure of FIG. 9C.

Figure 9E:
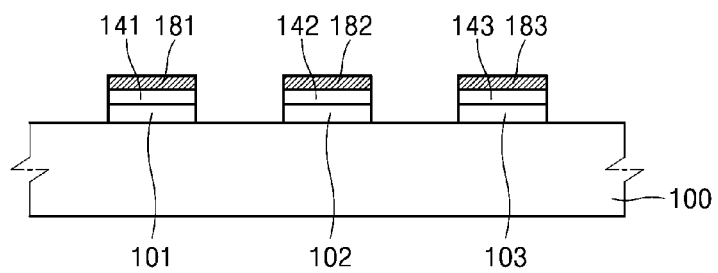

Referring to FIG. 9E, a third lift-off process is performed to entirely remove the remaining third lift-off layer 123. Accordingly, portions of the first organic functional layer 141 and the first auxiliary cathode 181 are formed on the first anode 101, portions of the second organic functional layer 142 and the second auxiliary cathode 182 are formed on the second anode 102, and portions of the third organic functional layer 143 and the third auxiliary cathode 183 are formed on the third anode 103, as patterns.

Figure 11:
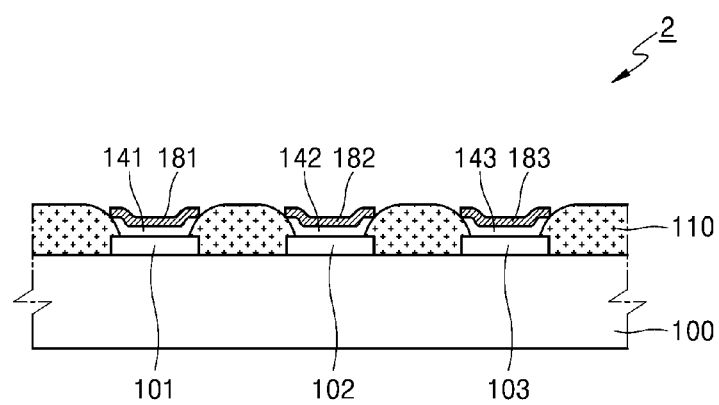
FIG. 11 is a schematic cross-sectional view of an organic light-emitting display apparatus manufactured by a manufacturing method according to a second exemplary embodiment.

FIG. 11 is a schematic cross-sectional view of an organic light-emitting display apparatus 2 according to a second exemplary embodiment.

The organic light-emitting display apparatus 2 of FIG. 11 may be manufactured in a manner similar to that of the method of manufacturing the organic light-emitting display apparatus 1 of FIG. 2 illustrated with FIGS. 3 to 6E described above. Hereinafter, brief descriptions will be provided mainly focusing on differences with the method of manufacturing the organic light-emitting display apparatus 1 of FIG. 2 described above.

Referring to FIG. 11, a plurality of anodes including the first to third anodes 101 to 103 are formed on the substrate 100, and a pixel-defining layer 110 surrounding edges of the first to third anodes 101 to 103 are formed. The pixel-defining layer 110 defines an emission region, and prevents short circuits of the first to third anodes 101 to 103 and the first to third auxiliary cathodes 181 to 183.

In the present exemplary embodiment, the first to third anodes 101 to 103 and the pixel-defining layer 110 are formed, and then, first to third unit processes illustrated with reference to FIGS. 3 to 6E are performed.

Through the first to third unit processes, the first to third organic functional layers 141 to 143 and the first to third auxiliary cathodes 181 to 183 are formed on the first to third anodes 101 to 103.

Figure 12:
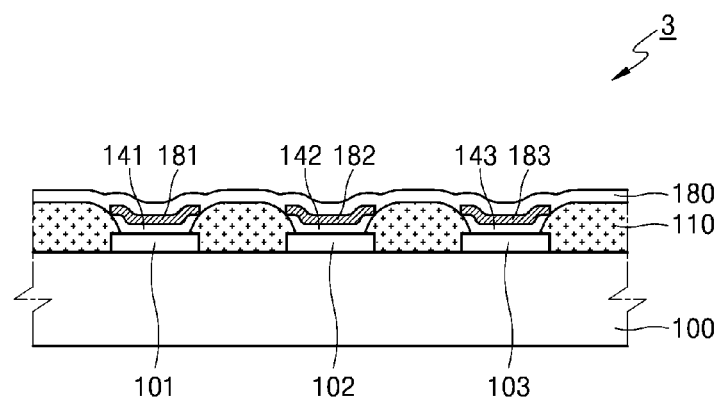
FIG. 12 is a schematic cross-sectional view of an organic light-emitting display apparatus manufactured by a manufacturing method according to a third exemplary embodiment.

FIG. 12 is a schematic cross-sectional view of an organic light-emitting display apparatus 3 according to a third exemplary embodiment.

The organic light-emitting display apparatus 3 of FIG. 12 may be manufactured in a manner similar to that of the method of manufacturing the organic light-emitting display apparatus 1 of FIG. 2 illustrated with reference to FIGS. 3 to 6E described above. Hereinafter, brief descriptions will be provided mainly focusing on differences with the method of manufacturing the organic light-emitting display apparatus 1 of FIG. 2 described above.

Referring to FIG. 12, a plurality of anodes including the first to third anodes 101 to 103 are formed on the substrate 100, and the pixel-defining layer 110 surrounding edges of the first to third anodes 101 to 103 are formed. The pixel-defining layer 110 defines an emission region, and prevents short circuits of the first to third anodes 101 to 103 and the first to third auxiliary cathodes 181 to 183.

In the present exemplary embodiment, the first to third anodes 101 to 103 and the pixel-defining layer 110 are formed, and then, first to third unit processes illustrated with reference to FIGS. 3 to 6E are performed.

Through the first to third unit processes, the first to third organic functional layers 141 to 143 and the first to third auxiliary cathodes 181 to 183 are formed on the first to third anodes 101 to 103.

After the third unit process is performed, the cathode 180 is integrally formed on the first to third auxiliary cathodes 181 to 183 as a common electrode.

When the first to third organic functional layers 141 to 143 are deposited in the respective unit processes, the first to third auxiliary cathodes 181 to 183 are continuously deposited on the first to third organic functional layers 141 to 143. In this manner, damage to the first to third organic functional layers 141 to 143 may be prevented during a succeeding lift-off process. In addition, since the first to third auxiliary cathodes 181 to 183 electrically contact the cathode 180 commonly formed over a plurality of pixels after the first to third unit processes, the first to third auxiliary cathodes 181 to 183 may prevent a voltage drop in the cathode 180.

Although not illustrated in the drawings, the organic light-emitting display apparatuses described herein may further include an encapsulation member for encapsulating an organic emission layer. The encapsulation member may include a glass substrate, metal foil, a thin film encapsulation layer including an inorganic layer and an organic layer stacked on each other, etc.

According to one or more embodiments, since an emission layer is formed without using a fine metal mask (FMM), a high-resolution display panel may be formed.

Also, a failure rate may be decreased by preventing degradation of an organic emission layer by forming a barrier layer between a lift-off layer including a fluoropolymer and photoresist.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an organic light-emitting display apparatus, the method comprising:
    forming a first electrode on a substrate;
    forming a first lift-off layer comprising a fluoropolymer on the first electrode;
    forming a first barrier layer on the first lift-off layer, the first barrier layer having a higher fluorine content than the first lift-off layer;
    forming a first photoresist on the first barrier layer, the first photoresist having a first portion overlapping the first electrode and a second portion outside the first portion;
    removing the first portion of the first photoresist by patterning the first photoresist, such that the second portion of the first photoresist is remained on the first barrier layer;
    exposing the first electrode by etching the first lift-off layer and the first barrier layer disposed on the first electrode;
    forming a first organic functional layer comprising a first emission layer on the first electrode and the second portion of the first photoresist;
    removing remaining portions of the first lift-off layer, the first barrier layer, the first photoresist, and the first organic functional layer disposed on the second portion of the first photoresist; and
    forming a second electrode on the first organic functional layer.

2. The method of claim 1, wherein the first lift-off layer comprises about 20 wt % to about 60 wt % of fluorine.

3. The method of claim 1, wherein the first barrier layer comprises about 40 wt % to about 76 wt % of fluorine.

4. The method of claim 1, wherein the first organic functional layer further comprises at least one of a hole injection layer, a hole transport layer, an electron transport layer, and an electron injection layer.

5. The method of claim 1, wherein forming the first organic functional layer comprises a deposition process.

6. The method of claim 1, wherein removing the first portion of the first photoresist comprises a photolithography process.

7. The method of claim 1, wherein exposing the first electrode comprises etching the first lift-off layer and the first barrier layer disposed on the first electrode with a first solvent comprising fluorine.

8. The method of claim 7, wherein the first solvent forms:
    a first undercut profile in the first barrier layer under the first photoresist; and a second undercut profile in the first lift-off layer under the first barrier layer.

9. The method of claim 8, wherein a shape of the first undercut profile and a shape of the second undercut profile are different from each other.

10. The method of claim 1, wherein the remaining portions of the first lift-off layer, the first barrier layer, the first photoresist, and the first organic functional layer disposed on the second portion are removed by using a second solvent comprising fluorine.

11. The method of claim 1, further comprising forming a pixel-defining layer surrounding edges of the first electrode.

12. The method of claim 1, further comprising, forming a first auxiliary cathode during a process of forming the first organic functional layer, before forming the second electrode.

13. A method of manufacturing an organic light-emitting display apparatus, the method comprising:
forming a plurality of primary electrodes on a substrate;
performing a first unit process comprising:
(a1) forming a first lift-off layer comprising a fluoropolymer on a first primary electrode of the primary electrodes;
(b1) forming a first barrier layer on the first lift-off layer, the first barrier layer having a higher fluorine content than the first lift-off layer;
(c1) forming a first photoresist on the first barrier layer and removing a first portion of the first photoresist overlapping the first primary electrode by patterning the first photoresist, such that a second portion of the first photoresist outside the first portion is remained on the first barrier layer;
(d1) exposing the first primary electrode by etching the first lift-off layer and the first barrier layer disposed on the first primary electrode;
(e1) forming a first organic functional layer comprising a first emission layer on the first primary electrode and the second portion of the first photoresist; and
(f1) removing remaining portions of the first lift-off layer, the first barrier layer, the first photoresist, and the first organic functional layer disposed on the second portion of the first photoresist;
performing a second unit process after the first unit process, the second unit process comprising:
(a2) forming a second lift-off layer comprising a fluoropolymer on a second primary electrode of the primary electrodes;
(b2) forming a second barrier layer on the second lift-off layer, the second barrier layer having a higher fluorine content than the second lift-off layer;
(c2) forming a second photoresist on the second barrier layer and removing a third portion of the second photoresist overlapping the second primary electrode by patterning the second photoresist, such that a fourth portion of the second photoresist outside the third portion is remained on the second barrier layer;
(d2) exposing the second primary electrode by etching the second lift-off layer and the second barrier layer disposed on the second primary electrode;
(e2) forming a second organic functional layer comprising a second emission layer on the second primary electrode and the fourth portion of the second photoresist; and
(f2) removing remaining portions of the second lift-off layer, the second barrier layer, the second photoresist, and the second organic functional layer disposed on the fourth portion of the second photoresist; and
forming a secondary electrode after the first and second unit processes.

14. The method of claim 13, wherein light emitted from the first emission layer and light emitted from the second emission layer have different colors from each other.

15. The method of claim 13, wherein the step dl and the step d2 comprise wet etching using a first solvent comprising fluorine.

16. The method of claim 13, wherein a second solvent comprising fluorine is used in the step f1 and the step f2.

17. The method of claim 13, wherein the secondary electrode is integrally formed on the first and second organic functional layers as a common electrode.

18. The method of claim 17, further comprising forming auxiliary cathodes during the step e1 and the step e2, before forming the secondary electrode.

19. The method of claim 13, further comprising forming pixel-defining layers surrounding edges of the first primary electrode and the second primary electrode.

* * * * *